United States Patent [19]

Smith et al.

[11] Patent Number: 5,757,183
[45] Date of Patent: May 26, 1998

[54] DEVICE TO SHIELD A MAGNETIC FIELD IN A GIVEN PLANE

[75] Inventors: Neil Smith, San Diego; Frederick John Jeffers, Escondido, both of Calif.

[73] Assignee: Eastman Kodak Company, Rochester, N.Y.

[21] Appl. No.: 686,905

[22] Filed: Jul. 26, 1996

[51] Int. Cl.$^6$ .................................................. G01R 33/02
[52] U.S. Cl. ................................... 324/244; 324/252
[58] Field of Search .................................. 324/244, 225, 324/260, 252, 262; 336/84 R, 84 M, 84 C

[56] References Cited

U.S. PATENT DOCUMENTS

| | | | |
|---|---|---|---|
| 4,317,078 | 2/1982 | Weed et al. | 324/207.26 |
| 4,432,028 | 2/1984 | Desserre et al. | 324/252 |
| 4,963,827 | 10/1990 | Popovic et al. | 324/252 |

Primary Examiner—Walter E. Snow
Attorney, Agent, or Firm—William F. Noval

[57] ABSTRACT

A magnetic field sensing system comprising:

a magnetic field shielding structure including a series of N annular rings of inner diameter, a, outer diameter, b, and thickness, t, the series of magnetic rings being geometrically aligned so to be concentric to a common axis of concentricity, the number of rings N being equal to or greater than two, the rings being formed from a high permeability, magnetically soft ferromagnetic material of permeability $\mu$, and where the rings are physically separated from each other by a series of N-1 spacer layers made from any nonmagnetic material (including in part air), and which function to space the magnetic rings apart by a distance t', and wherein the series of N high permeability magnetic rings and N-1 nonmagnetic spacer layers form stack of length L=Nt+ (N-1) t' along the direction parallel to the axis of concentricity; and a magnetic field sensor located within the structure aligned with common axis of concentricity.

10 Claims, 6 Drawing Sheets

DEVICE TO SHIELD A MAGNETIC FIELD IN A GIVEN PLANE

FIELD OF INVENTION

This invention relates in general to magnetic systems and more particularly to a ring shield structure for a magnetic field sensor.

BACKGROUND OF THE INVENTION

Magnetic field sensors/magnetometers using magnetoresistive (MR) thin films as the detection element are known to be one of the best available technologies for making very high sensitivity field sensors that are physically rugged, small in size, consume little power, and have relatively low cost. One drawback of conventional MR sensors, particularly those designed for maximum field sensitivity, is that MR elements are intrinsically nonlinear, and can be magnetically saturated in relatively small magnetic fields. This will in general greatly reduce the MR element's field sensitivity. Hence, conventional MR sensors cannot usually be used effectively to detect small changes in the local magnetic field when operating in an environment with a sufficiently large, static magnetic field present.

One practical example of this problem would be the use MR sensor technology to as a quick, noninvasive safety diagnostic to detect the presence of very small pieces of ferrous metal embedded (e.g., from past injuries or occupational hazards) in the eyes or brains of patients prior to a magnetic-resonance-imaging (MRI) examination. The very large, 15 kOe magnetic fields present in MRI machines would likely rotate or dislodge such ferrous bodies, potentially causing severe injury. Exposing the patients to much smaller (~100 Oe) fields, one could safely magnetize such embedded ferrous objects, and detect the small magnetic fields (orthogonal to the magnetizing field) produced by these magnetized bodies with close proximity, highly sensitive MR field sensors, which would necessarily need to operate in the aforementioned ~100 Oe field environment.

Virtually all individual MR sensor elements are, in general, also directional, with optimal field sensing capability along a preferred direction, or axis, that is determined by the geometry of the sensing element. MR sensors are usually magnetically biased to give a linear response for magnetic fields oriented along the preferred axis. However, due to intrinsic magnetic nonlinearity of the MR element, the presence of moderate or even small static and/or transient magnetic fields (e.g. the Earth's ~0.5 Oe magnetic field) in directions orthogonal to the preferred sensing direction, can still alter the sensitivity of the device, decrease its dynamic range, and/or cause or exacerbate magnetic instabilities which can result in the well known and highly undesirable Barkhausen noise in the output signal of the MR sensor.

One approach to solving both of the aforementioned problems of high sensitivity MR sensors is to develop a highly anisotropic magnetic shielding structure, which could provide a shielding factor ratio of the order of 1000 along orthogonal spatial axes. In particular, such a shielding structure would have a single axis of low to zero magnetic shielding, while simultaneously providing large shielding (with ≧1000 extinction factor) along the two orthogonal spatial axes. With the axis of low shielding factor oriented parallel to the preferred sensing axis of the MR element, the MR sensor would lose little or no magnetic sensitivity, while benefiting from a 1000-fold or more increase in immunity to magnetic perturbation by background magnetic fields orthogonal to the sensing direction.

SUMMARY OF THE INVENTION

The invention consists of a concentric stack of annular rings of high permeability, soft magnetic material, separated by an alternating stack of concentric spacer rings made of any nonmagnetic material (including air). With such a geometry shielding structure, one can achieve high shielding factors of order 1000 for fields orthogonal to the axis of the ring-stack, and very low shielding factors of about 1.2—1.2 for fields parallel with the axis of the ring-stack. By adjusting the thickness of the magnetic rings, along with the ratio of inner to outer diameter, one can adjust not only the shielding ratios, but also the saturation field for the rings, and the active interior volume over which where such shielding factors are maintained.

According to a feature of the present invention, there is provided a magnetic field sensing system comprising:

a magnetic field shielding structure including a series of N annular rings of inner diameter, a, outer diameter, b, and thickness, t, the series of magnetic rings being geometrically aligned so to be concentric to a common axis of concentricity, the number of rings N being equal to or greater than two, the rings being formed from a high permeability, magnetically soft ferromagnetic material of permeability μ, and where the rings are physically separated from each other by a series of N-1 spacer layers made from any nonmagnetic material (including in part air), and which function to space the magnetic rings apart by a distance t', and wherein the series of N high permeability magnetic rings and N-1 nonmagnetic spacer layers form stack of length L=Nt+(N-1) t' along the direction parallel to the axis of concentricity; and a magnetic field sensor located within the structure aligned with common axis of concentricity.

Advantageous Effect of the Invention

The present invention provides a simple, compact, inexpensive, highly anisotropic magnetic shielding structure which can provide a large shielding factor of order 1000 (with saturation immunity to fields up to order 1000 Oe) in a plane, while simultaneously resulting in virtually no shielding of magnetic fields along an orthogonal axis. Such a shielding structure can be used to house a highly sensitive but nonlinear magnetic field sensor (e.g., a magnetoresistive thin-film sensor), to allow detection of small field changes along a field sensing axis, while the sensor simultaneously resides in a very large magnetic field (in the shielding plane) which would otherwise saturate the sensor and render it nonfunctional.

DETAILED DESCRIPTION OF THE INVENTION

Figure 1:
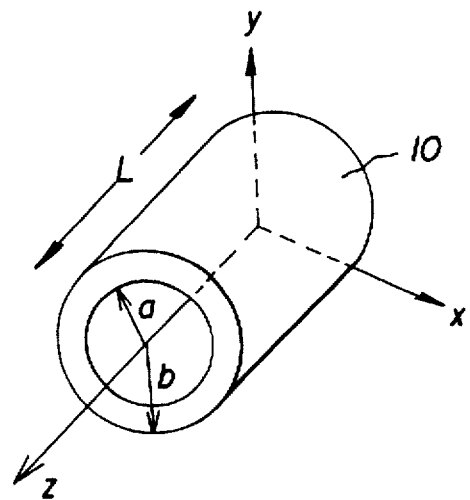
FIG. 1 is a perspective view of a simple annular cylinder section shielding structure.

FIG. 1 shows a simple annular cylinder section 10 shielding structure. In the 2-D limit of L/D→∞, the shielding factor of this geometry for radial fields (i.e., along x and/or y-axes, orthogonal to the z-axis) is known analytically, and is given by the simple expression $$F_r = H_{ext}/H_r(r<a) = [(\mu+1)^2 - (a/b)^2(\mu-1)^2]/(4\mu) \approx \mu[1-(a/b)^2]/4 \quad (1)$$

where $H_{ext}$ is the external (radial) field, and $\mu$ is the magnetic permeability of the material of which the shield is constructed. The shielding factor is the ratio of the amplitudes of the (unshielded) external field to the internal (shielded) field. Shielding materials known generically as mu-metal, that are readily available commercially, typically can have permeabilities on the order of $\mu \sim 10,000$, and so for a geometry with $a/b \leq 1/\sqrt{2}$, one can theoretically obtain radial shielding factors in excess of 1000. For the annular cylinder, the value of $H_{ext}$ at which point the shield material first begins to magnetically saturate, is also known, and is approximately given as $$H_{sat} = [(\mu+1)-(a/b)(\mu-1)]/2\mu)B_s \approx [1-a/b]/2B \quad (2)$$

Here, $B_s$ is the saturation flux density of the shielding material, and is typically $\geq 10^4$ G. Assuming again the case that $a/b \leq 1/\sqrt{2}$, it follows that $H_{sat} \geq B_s/7$, and such a shield will operate without loss of shielding factor for external fields $H_{ext}$ in excess of 1000 Oe. For finite L/D geometries, both $F_r$ and $H_{sat}$ will be reduced from that predicted by the above equations, but provided $L/D \geq 2$, these expressions are in general sufficiently for most design purposes.

The finite annular cylinder will also provide some shielding for axial (z-axis) fields as well. A rough, approximate solution for the shielding factor along the cylinder axis r=0, most valid for $\mu \to \infty$ and $H_{ext} < H_{sat} \approx B_s(b-a)/L$, is given by $$F_z(Z) = H_{ext}/H_z(r=0,z) \approx \cos h(2.4(L/D)(b/a))/\cos h(2.4z/a) \quad (3)$$

In particular, at the cylinder center r=z=0, this simplifies to $F_z(0) = \cosh(2.4 \, L/D \, b/a)$. For L/D=1 and b/a=√2, one then estimates that $F_z(0) \sim 15$. Hence, the simple annular cylinder, made from high-$\mu$ materials, can provide large ($\geq 1000$) radial shielding factors, while simultaneously providing the large anisotropy in orthogonal shielding factors $F_r/F_z(0) \geq 100:1$ desired of the present invention. The one major disadvantage of the annular cylinder, however, is that even along the low shielding z-axis, the shielding factor $F_z(z) \geq 10$ will sharply reduce the field sensitivity of any enclosed z-axis field detector by over an order of magnitude. Although $F_z$ can be further decreased by choosing cylinder geometries where L/D<1, or a/b→1, this simultaneously begins to substantially degrade the radial shielding factor $F_r$, as well as $H_{sat}$.

Figure 2:
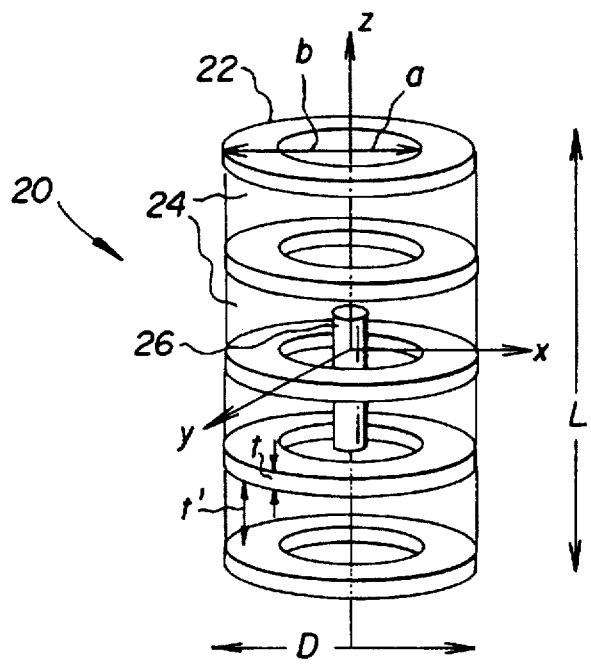
FIG. 2 is a perspective view of a MR shielding structure according to the present invention.

According to the present invention, there is provided an anisotropic shielding structure which can simultaneously achieve $F_r \sim 1000$, and $F_z \sim 1$, whereby $F_r/F_z >> 100$ without any significant loss in z-axis field detection sensitivity. The basic structure 20, shown in FIG. 2, consists of a stack of N annular rings 22, concentric to a common axis (the z-axis), that are made of the same high permeability, soft magnetic material as discussed above. The high permeability rings 22 are separated from each other by an alternating series of N-1 nonmagnetic spacers 24 made of any convenient nonmagnetic material (including air). By interrupting the low reluctance path (along the z-axis) of the previous annular cylinder with the series of "air"-gaps, the effective z-axis permeability of the ringed structure 20 of FIG. 2 is limited to $\mu_{z-eff} \approx (1+t/t')/(1+t/\mu t') \approx 1+t/t'$ provided that $t/\mu << t'$. In addition to limiting $\mu_{z-eff} \leq 2$, the choice of $t \leq t'$ is also mechanically convenient, and reduces the required volume of the expensive magnetic material. The choice of t'<< a insures that the magnitude of either shielding factor $F_z(r \leq a/2,z)$, and particularly $F_r(r \leq a/2,z)$, is relatively constant with z-position. Magnetic field sensor 26 is located in structure 26 aligned with its common z-axis. Sensor 26 can be an MR sensor.

Figure 3:
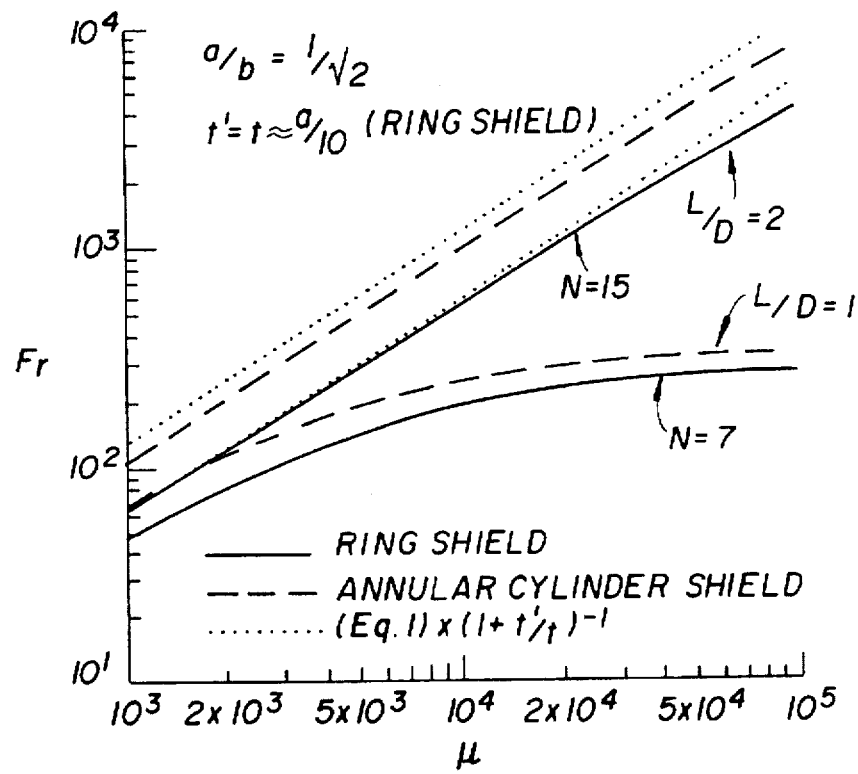
FIGS. 3–7 are graphical views useful in explaining the present invention.

FIG. 3 is a graphical view of $F_r$ vs. $\mu$ and shows finite element computations of the radial shielding factor $F_r(r=z=0)$ at the geometric center of both the solid rectangular cylinder, as well as the inventive ringed shielding structures, as a function of the shield materials permeability, $\mu$. The case a/b=1/√2 is assumed for both shielding structures, and for the ringed structure, it is additionally assumed that t=t'≈a/10, corresponding to an N=7-ring or N=15-ring structure for the geometries L/D=1 or L/D=2, respectively. Also shown in FIG. 3 are the analytical predictions from Eq. 1, which though based on the assumption that L/D>>1, are seen to already be quite accurate for L/D=2. Within the same L/D>>1 approximation, one would expect that Fr for the ringed structure should be scaled down by the factor $(1+t'/t)^{-1}$ from that predicted by Eq. 1, which is also born out by the numerical computations. For L/D=1, the solid cylinder and 7-ring shield structures are more closely matched in shielding factor (for all $\mu$), although here one observes a significant loss in shielding factor at large $\mu \geq 10^4$ when compared to geometries with $L/D \geq 2$. However, radial shielding factors >100 are still readily obtainable for ringed-shields with L/D≈1, which may be a more practical geometry in situations in which minimizing shield size is a consideration.

Figure 4:
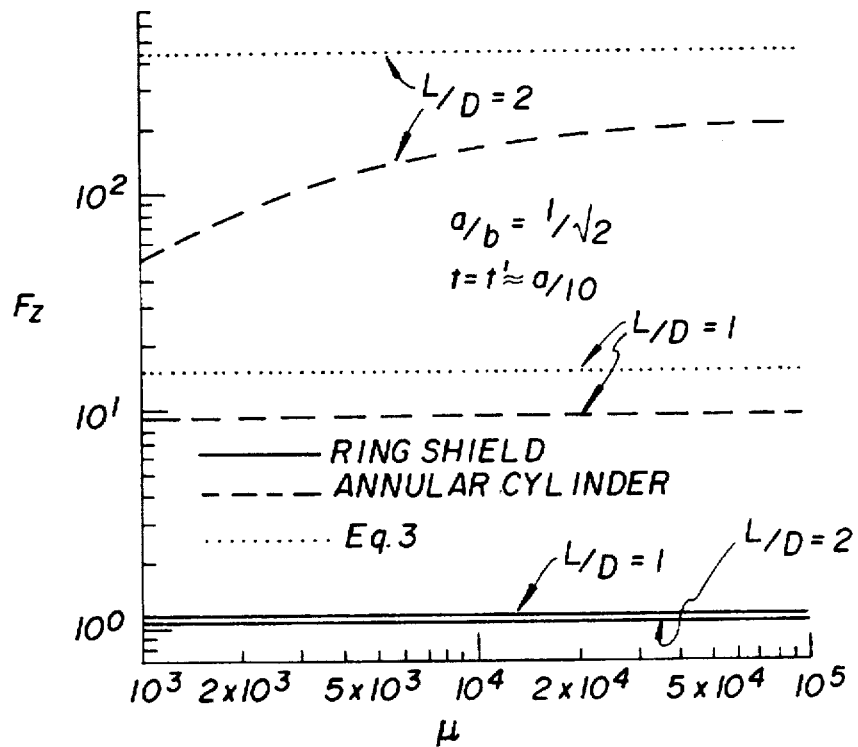

FIG. 4 is a graphical view of $F_z$ vs. $\mu$ and shows the analogous computed results for the axial (i.e., z-axis) shielding factor $F_z$ (r=z=0), and it is here where the benefits of the ringed shielding structure for achieving maximum shielding anisotropy $F_r/F_z$ while minimizing $F_z \to 1$ are most apparent. For the ringed structure of the invention, Fz≤1.1 regardless of either permeability $\mu$, or size ratio L/D, and such a ringed shield will cause virtually no loss in z-axis sensitivity for any magnetic field detector centrally located inside. In contrast, z-axis shielding for the solid cylindrical shield can be very substantial, particularly for L/D>1. The predictions of Eq. 3 for $F_z$(z=0), also shown in FIG. 4, are in fair agreement with the $\mu \to \infty$ limit numerical results for the solid cylindrical shield.

Figure 5:
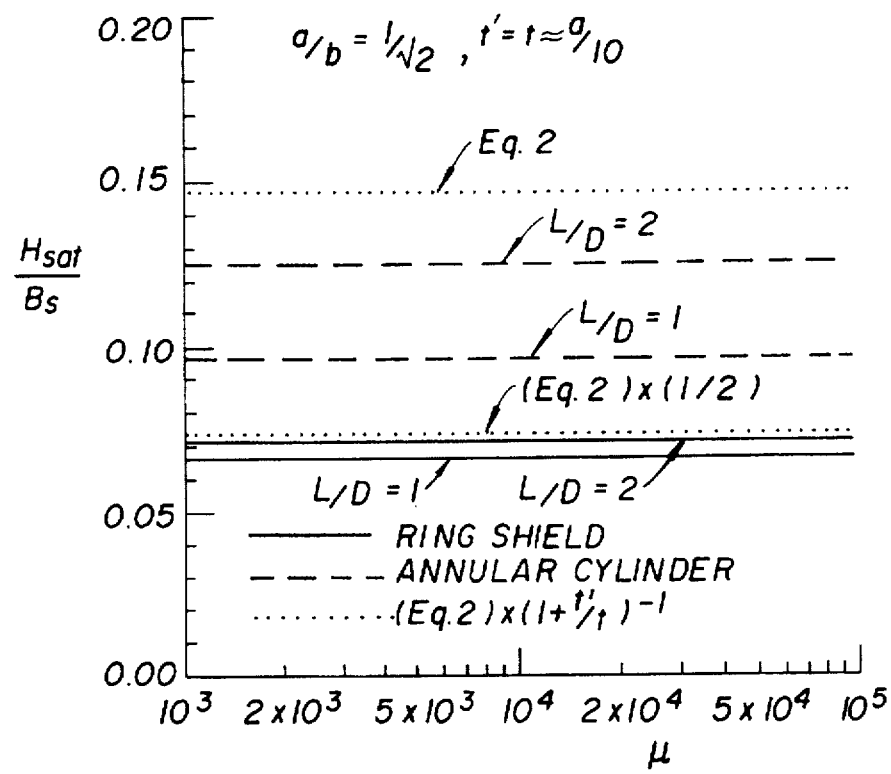

FIG. 5 is a graphical view of $H_{sat}/B_s$ vs. $\mu$ and shows both computed and predicted (via Eq. 2) results for the ratio $H_{sat}/B_s$. For the ringed-shield case, Eq. 2, like Eq. 1, should be multiplied by the scaling factor $(1+t'/t)^{-1}$. For typical $B_s \sim 10^4$ G, $H_{sat} \sim 1000$ Oe can be achieved for the ring-shield. As before, the analytical predictions agree reasonably well with computed results for L/D≥2, here especially in this case for the ring-shield. It is noted, however, that saturation in the end, outermost rings will begin at fields of roughly $H_{sat}/2$, though provided N>>1, this effect should have a minor influence on the central shielding factor for $H_{sat}/2 \leq H \leq H_{sat}$. One way to reduce, if not eliminate this end effect would be to approximately double the magnetic thickness of the two outermost shielding rings.

Figure 6:
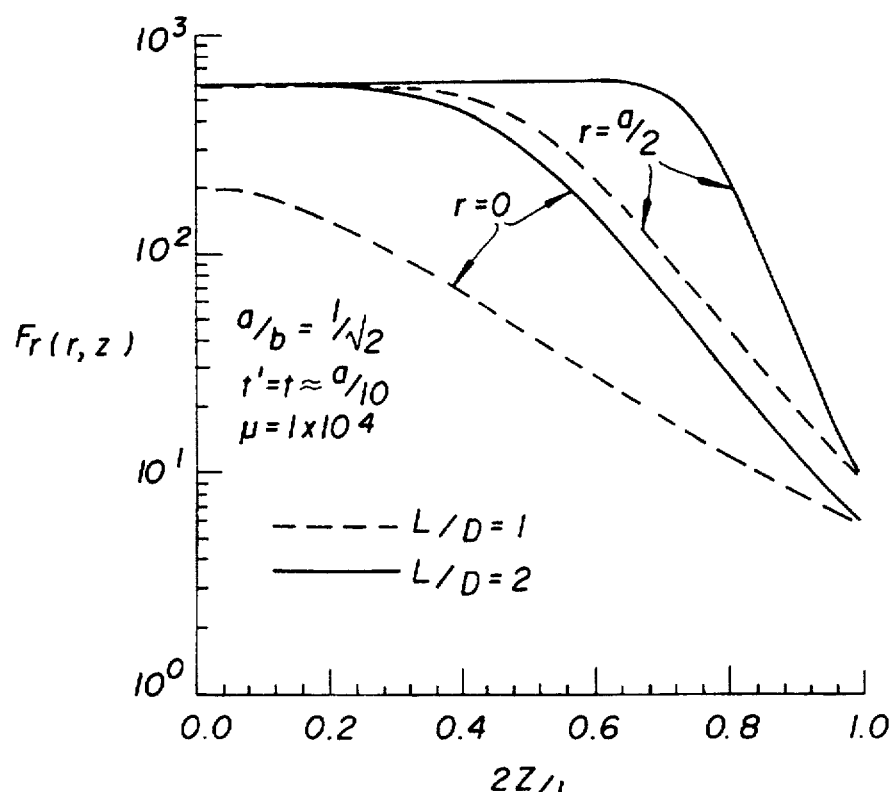

FIG. 6 is a graphical view of $F_r(r,z)$ vs. 2z/L and gives some indication as to the spatial uniformity of the radial shielding factor $F_r(r,z)$ for locations other than the geometric center $r=z=0$. Due to the nonuniformity of the interior demagnetizing fields, the shielding factor is generally smallest in magnitude, along the central axis $r=0$, where it is also usually least uniform as a function of axial position, z (at least for $r \leq a/2$). In general, this effect is by far most pronounced for geometries in which $L/D \leq 1$. On the other hand, provided that $L/D \geq 2$, more ideal shielding is obtainable, and the shielding factor $F_r(r,z)$ will in general be quite uniform over the interior volume $r \leq a/2$, and $|2z/L| \leq \frac{1}{2}$, particularly for the practical case $t'/a<<1$.

Figure 7:
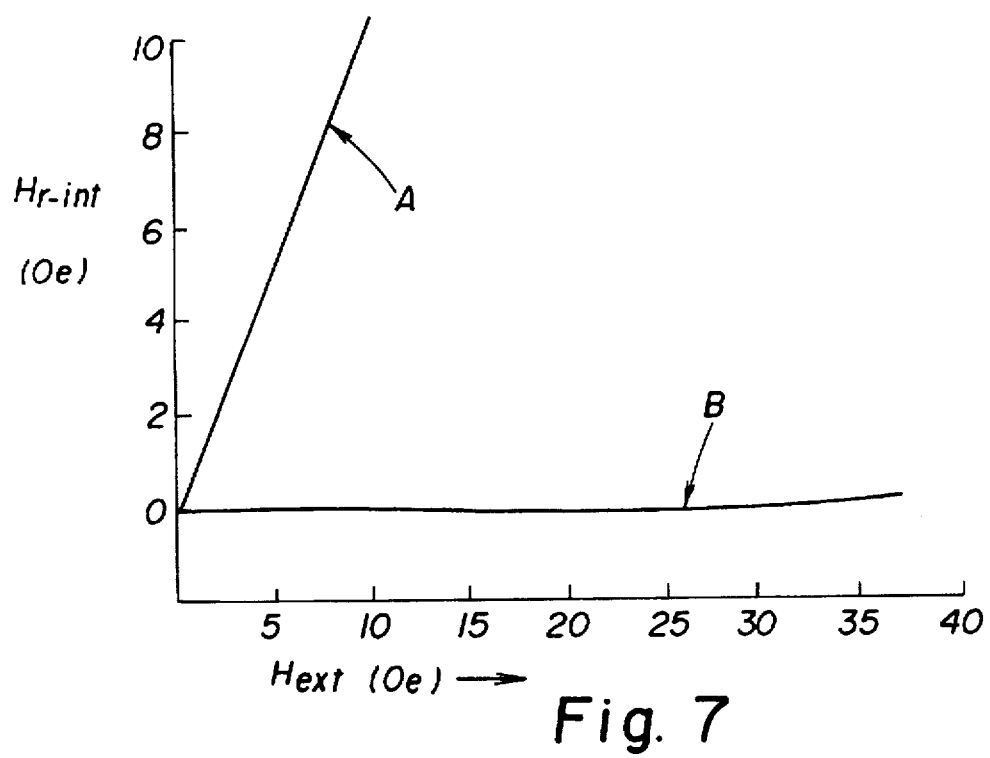

FIG. 7 is a graphical view of an experimental result for $H_{r-int}$ ($r \equiv z \equiv 0$) vs. $H_{ext}$ measured using an N=14 ring-shield with dimensions D=2b=1.01", a=0.374", L=1.30", t=0.029", and t'=0.068". A is a plot without ring-shield. B is a plot with ring-shield. The shielding rings were made from "CO-NETIC" alloy (Magnetic Shield Corporation, Bensenville, Ill.) with $\mu \sim 10^4$. Although the actual device still showed some degree of hysteresis, the measurements on the forward pass (increasing $H_{ext}$) immediately subsequent to demagnetizing the shielding structure showed an $H_{r-int}$ of 0.12 Oe when $H_{ext}$-37.5 Oe, corresponding to a shielding factor of $F_r=37.5/0.12=312$. Including the $(1+t'/t)^{-1}=0.30$ correction factor in Eq. 1, one would predict a shielding factor of $0.30\mu(1-(0.37)^2/4 \sim 650$ in the limit $L/D>>1$. Given the actual L/D=1.28, one estimates from FIG. 1 (for $\mu \sim 10^4$) about a factor of two additional reduction in $F_r$, giving a predicted shielding factor of ~330, which is in good agreement with the measured value. Measurement of the axial shielding factor yielded the value $F_z=1.07$, also in very good agreement with expectations (see FIG. 4).

Figure 8:
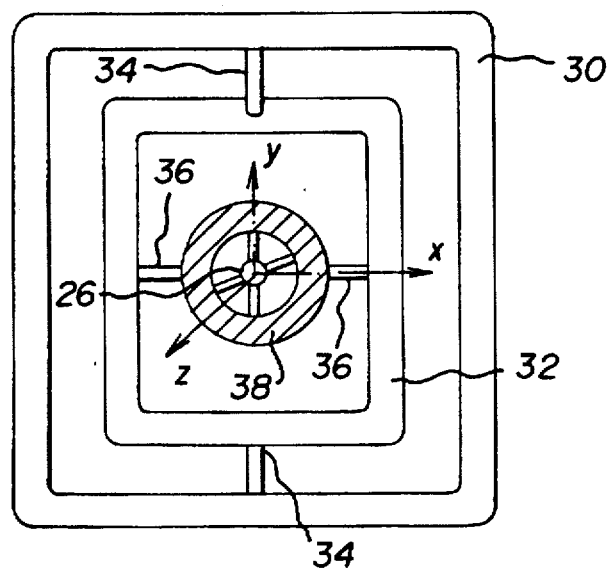
FIG. 8 is a plan view of a self-aligning gimbal mounting for the shield structure of the invention.
Figure 9:
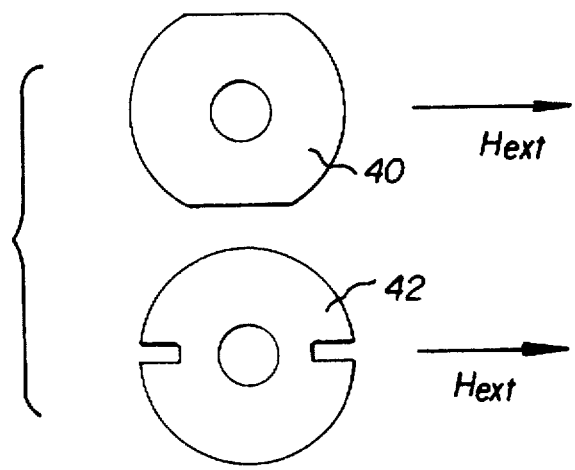
FIG. 9 are diagrammatic views of two modified ring structures according to the invention.
Figure 10:
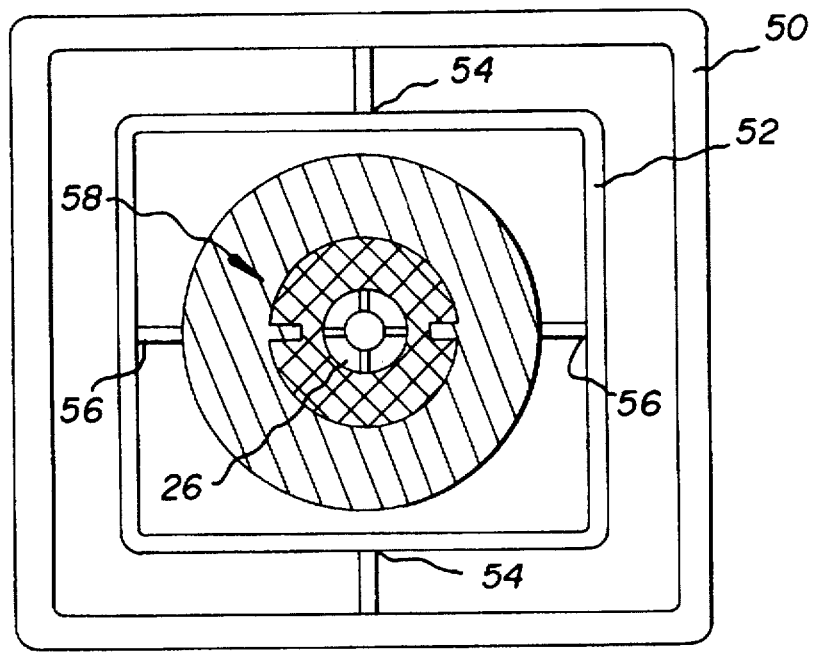
FIG. 10 is a plan view of another self-aligning gimbal mounting, ring shield structure according to the invention.

Due to its anisotropic nature, the presently invented shielding-ring structure will, if left free to rotate about a radial (x or y) axis, naturally align itself with its z-axis perpendicular to the large, external field in order to minimize the radial torque on the structure. With suitable mechanical mounting (e.g., FIG. 8), this "self-aligning" feature can be exploited to automatically minimize the unwanted z-axis component of $H_{ext}$ that is not shielded (since $Fz \approx 1$), including that resulting from small but inevitable spatial nonuniformities in $H_{ext}$. As shown, the mounting structure includes stationary mounting frame 30 to which is pivotally mounted inner ring 32 by pivots 34. Ring shield 38 is pivotally mounted to ring 32 by pivots 36. Because thin-film MR sensors are generally insensitive to fields perpendicular to the film plane, additional desensitization to any residual radial field $H_{ext}/F_r$ may be achieved by aligning the plane of the sensor orthogonal to $H_{ext}$. This may also be made self-aligning by breaking the circumferential symmetry of the ring. FIG. 9 shows two examples (i.e., clipped ring 40 and notched ring 42) of a modified ring shape, and the preferential alignment with respect to $H_{ext}$ which minimizes the z-axis torque. It is likely to be necessary to modify only the outermost two rings to achieve the latter self-alignment, which would have negligible impact on the radial shielding factor $F_r$ near the interior location of the sensor. Modified from FIG. 8 by the addition of radial ball bearing FIG. 10 shows one mechanical design of a fully 3-axis, self-aligning ring-shield structure. As shown, stationary frame 50 pivotally mounts ring 52 by pivots 54. Notched shield ring 60 is supported by nonmagnetic radial ball bearing 58 pivotally mounted in ring 52 by pivots 56.

It is not essential that the shielding rings have a purely circular shape, particularly regarding their outer perimeter. For example, if manufactured by being punched from a sheet of high permeability sheet metal, a rectangular or hexagonal outer boundary would allow virtually 100% utilization of the sheet material without any excess waste between rings.

Figure 11:
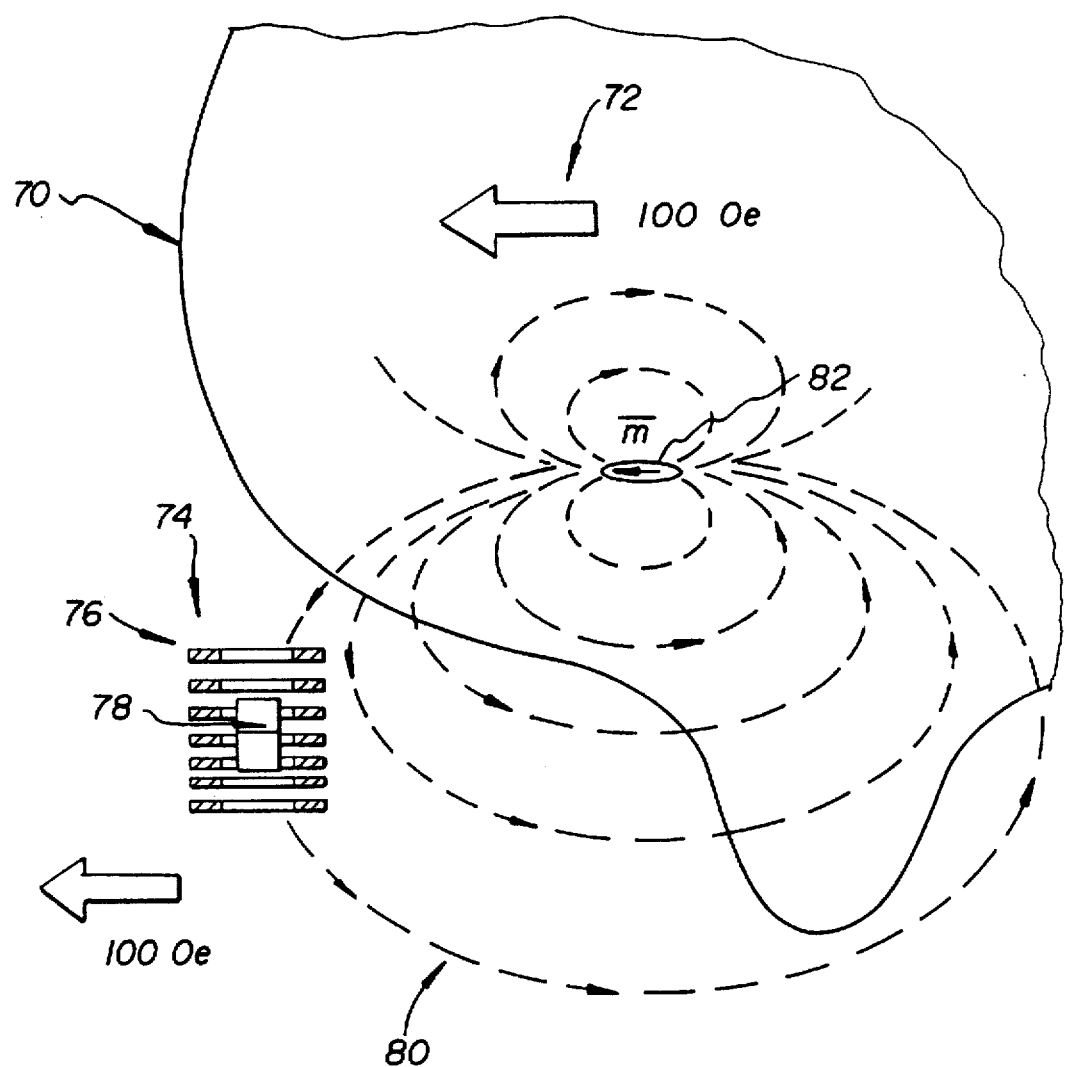
FIG. 11 is a diagrammatic view of the application of the present invention to locate magnetic foreign bodies in a human.

FIG. 11 is a diagrammatic view useful in illustrating a method of the present invention. The method uses the magnetic field sensing system of FIG. 2 to locate a magnetic foreign body, such as a metal fragment, in an object, such as a human body part. As shown, looking down on a patient's head 70, a moderate 100 Oe magnetic field 72 is applied to head 70. Magnetic field sensing system 74 including MR sensor 76 and ring shield structure 78 is located next to head 70. Sensor 76 detects the $H_x$ fringing field 80 component of the magnetized foreign object 82 embedded in head 70. The ring shield 76 reduces the $H_y$ field on the sensor 78 to ~0.3 Oe, which is of no concern.

The invention has been described in detail with particular reference to preferred embodiments thereof, but it will be understood that variations and modifications can be effected within the spirit and scope of the invention.

Parts List 10 annular cylinder section
20 ringed structure
22 rings
24 spacers
26 sensor
30 stationary mounting frame
32 inner ring
34 pivots
36 pivots
38 ring shield
40 clipped ring
42 notched ring
50 stationary frame
52 ring
54 pivots
56 pivots
58 radial ball bearing
60 notched shield ring
70 patient's head
72 magnetic field
74 magnetic field sensing system
76 sensor
78 ring shield structure
80 fringing field
82 magnetized foreign object

What is claimed is:

1. A magnetic field sensing system comprising:
    a magnetic field shielding structure including a series of N annular rings of inner diameter, a, outer diameter, b, and thickness, t, said series of magnetic rings being geometrically aligned so to be concentric to a common axis of concentricity, said number of rings N being equal to or greater than two, said rings being formed from a high permeability, magnetically soft ferromagnetic material of permeability $\mu$, and where said rings are physically separated from each other by a series of N-1 spacer layers made from any nonmagnetic material (including in part air), and which function to space the said magnetic rings apart by a distance t', and wherein said series of N high permeability magnetic rings and N-1 nonmagnetic spacer layers form stack of length L=Nt+(N-1)t' along the direction parallel to said axis of concentricity; and
    a magnetic field sensor located within said structure having a magnetic field of sensitivity aligned with common axis of concentricity, said sensor having a dimension along said axis which is less than L, and said sensor being enclosed with said magnetic field shielding structure.

2. The system of claim 1, wherein the permeability μ of said magnetic rings is approximately equal to or greater than 1000.

3. The system of claim 1, in which the ratio of $L/(a+b)$ of said structure is approximately equal to or greater than two.

4. The system of claim 1 wherein the ratio of $t/a$ is approximately equal to or smaller than 1/10.

5. The system of claim 1, in which the planar shape of the outer perimeter of the shielding rings is rectangular or hexagonal, rather than circular.

6. The system of claim 1 in which the thickness of the outer two shielding rings is twice that of the interior shielding rings.

7. The system of claim 1 wherein at least the outer two shield rings are provided with a self aligning shape.

8. The system of claim 7 wherein the self aligning shape consists of a pair of notches on opposite sides of at least the other two rings.

9. The system of claim 7 wherein the self aligning shape consists of two flats on opposite sides of at least the outer two rings.

10. The system of claim 7 wherein said sensor and said structure are mounted in a self aligning three dimensional pivoting gimbal structure.

* * * * *